United States Patent
Zhang et al.

(10) Patent No.: US 9,812,534 B2
(45) Date of Patent: Nov. 7, 2017

(54) SEMICONDUCTOR DEVICE AND METHOD OF MANUFACTURING THE SAME

(71) Applicant: Dynax Semiconductor, Inc., Kunshan (CN)

(72) Inventors: Naiqian Zhang, Kunshan (CN); Fengli Pei, Kunshan (CN)

(73) Assignee: DYNAX SEMICONDUCTOR, INC., Kunshan, Jiangsu Province (CN)

( * ) Notice: Subject to any disclaimer, the term of this patent is extended or adjusted under 35 U.S.C. 154(b) by 0 days.

(21) Appl. No.: 14/616,985

(22) Filed: Feb. 9, 2015

(65) Prior Publication Data
US 2016/0043184 A1 Feb. 11, 2016

Related U.S. Application Data

(63) Continuation-in-part of application No. PCT/CN2014/083848, filed on Aug. 7, 2014.

(51) Int. Cl.
| | |
|---|---|
| *H01L 29/40* | (2006.01) |
| *H01L 29/66* | (2006.01) |
| *H01L 29/778* | (2006.01) |
| *H01L 29/812* | (2006.01) |
| *H01L 29/20* | (2006.01) |
| *H01L 29/16* | (2006.01) |

(52) U.S. Cl.
CPC ...... *H01L 29/402* (2013.01); *H01L 29/66068* (2013.01); *H01L 29/66462* (2013.01); *H01L 29/7786* (2013.01); *H01L 29/812* (2013.01); *H01L 29/1608* (2013.01); *H01L 29/2003* (2013.01)

(58) Field of Classification Search
CPC H01L 29/402; H01L 29/1608; H01L 29/7786
USPC .......................................................... 257/77
See application file for complete search history.

(56) References Cited

U.S. PATENT DOCUMENTS

| | | | |
|---|---|---|---|
| 2011/0169054 A1* | 7/2011 | Wu | H01L 29/7787 257/194 |
| 2012/0018735 A1* | 1/2012 | Ishii | H01L 29/404 257/76 |
| 2013/0069173 A1* | 3/2013 | Chang | H01L 29/402 257/409 |
| 2014/0151749 A1* | 6/2014 | Jeon | H01L 29/66462 257/194 |

(Continued)

*Primary Examiner* — Marc Armand
*Assistant Examiner* — Warren H Kilpatrick
(74) *Attorney, Agent, or Firm* — Flener IP Law; Zareefa B. Flener

(57) ABSTRACT

A semiconductor device is disclosed, comprising: a substrate; a semiconductor layer disposed on the substrate; a source electrode and a drain electrode disposed on the semiconductor layer, and a gate electrode disposed between the source electrode and the drain electrode; a dielectric layer disposed on at least a part of the surface of the semiconductor layer which is between the gate electrode and the drain electrode, the dielectric layer having at least a recess therein; and a source field plate disposed on the dielectric layer and at least partially covering the recess, the source field plate being electrically connected to the source electrode through at least a conductive path. A method of manufacturing such a semiconductor device is also disclosed.

18 Claims, 10 Drawing Sheets

(56) References Cited

U.S. PATENT DOCUMENTS

2014/0312362 A1* 10/2014 Makiyama .......... H01L 29/7787
257/77

* cited by examiner

SEMICONDUCTOR DEVICE AND METHOD OF MANUFACTURING THE SAME

CROSS-REFERENCE TO RELATED APPLICATIONS

This application is a continuation-in-part of international application No. PCT/CN2014/083848 filed on Aug. 7, 2014, titled "Semiconductor Device and Method of Manufacturing the Same", which claims the benefit and priority of Chinese patent application No. 201310331682.X filed on Aug. 1, 2013, titled "Semiconductor Device and Method of Manufacturing the Same". Both of these applications are incorporated herein in their entirety by reference.

TECHNICAL FIELD

The disclosed embodiments relate to semiconductor devices, and more particularly to semiconductor devices having source field plates and methods of manufacturing such semiconductor devices.

BACKGROUND

III-V group compound semiconductor material, such as gallium nitride based semiconductor material, gallium arsenide based semiconductor material and indium phosphide based semiconductor material, has large band gap difference, and thus is used to form various heterojunction structures. In such heterojunction structures, quantum wells and two-dimensional electron gas with high concentration can be generated near heterojunction interfaces, such two-dimensional electron gas is trapped in the quantum wells, and thus carriers and ionized impurities are separated in space, thereby reducing Coulomb force of the ionized impurities against the carriers, eliminating effect of ionizing scattering centers, thus greatly improving mobility of the carriers. Therefore, III-V group compound semiconductor material has excellent electrical characteristics. Based on the characteristics of the III-V group compound semiconductor material, High Electron Mobility Transistors (HEMTs) using III-V group compound are formed, which have the characteristics of high mobility, high carrier concentration, high frequency, high temperature, high pressure and high power, so that they can be widely used in the fields of microwave, millimeter wave and radar systems and become one of the hot research topics in the field of semiconductor devices.

A HEMT device is a kind of plane-channel field effect transistors. In an HEMT device, most electric field lines are congregated at an edge of a gate electrode which is adjacent to a drain electrode, thus an electric field peak is generated. When a voltage applied between the gate electrode and the drain electrode increases, an electric field intensity at the edge will increase promptly, resulting in increase of leakage current of the gate electrode. Thus the device is likely to fail due to avalanche breakdown. Since a bearable pressure of the device is integration of an electric field intensity between the gate electrode and the drain electrode, compared with an electric field with uniform distribution, the sharper the electric field peak at the edge of the gate electrode is, the smaller the breakdown voltage bearable by the device is. The electric field peak at the edge of the gate electrode adversely affects use of the advantages of high breakdown voltage and high power, and increase of leakage current of the gate electrode deteriorates reliability of the device.

In order to improve the breakdown voltage of the HEMT device and therefore take full advantage of high output power of the HEMT device, approaches of reducing the electric field peak at the edge of the gate electrode using a field plate structure have been developed. As shown in FIG. 1, with such a structure, an area of a depletion region is increased by using a field plate, the bearable voltage in the depletion region is improved, and thus the breakdown voltage of the device is improved. In addition, with such a structure, distribution of the electric field lines in the depletion region of a barrier layer is modulated by using the field plate, the leakage current of the gate electrode is reduced.

Although use of source field plates may increase the breakdown voltage of devices, it increases gate-source capacitance Cgs of devices, which deteriorates frequency characteristics of devices, i.e., reduces $f_T$ and $f_{MAX}$. In order to reduce Cgs, as shown in FIGS. 2 and 3, an area of a portion of the source field plate overlapping the gate electrode can be reduced. However, this approach will delay frequency response of devices and affect frequency characteristics of devices. Accordingly, there is a need for semiconductor devices and methods of manufacturing the same that do not affect the frequency characteristics of devices and take full advantage of the source field plates.

SUMMARY

Embodiments of the present invention are directed to a semiconductor device which does not affect the frequency characteristics of devices and take full advantage of the source field plates.

Embodiments of the present invention are also directed to a method of manufacturing such a semiconductor device.

According to an embodiment of the present invention, a semiconductor device comprises: a substrate; a substrate; a semiconductor layer disposed on the substrate; a source electrode and a drain electrode disposed on the semiconductor layer, and a gate electrode disposed between the source electrode and the drain electrode; a dielectric layer disposed on at least a part of the surface of the semiconductor layer which is between the gate electrode and the drain electrode, the dielectric layer having at least a recess therein; and a source field plate disposed on the dielectric layer and at least partially covering the recess, the source field plate being electrically connected to the source electrode through at least a conductive path.

The dielectric layer may have a thickness of 100 nm-1000 nm.

The recess may extend to the upper surface of the semiconductor layer.

The dielectric layer may have a plurality of recesses therein. The plurality of recesses may be arranged in a direction from the source electrode to the drain electrode, and the depths of the plurality of recesses may be in ascending order in the direction.

The recess may have a cross-section shape of rectangle, or inverted trapezoid, or curve, or combinations thereof.

The recess may have a curved bottom.

The gate electrode may have a T shape or a gamma shape.

The dielectric layer may comprise a first dielectric layer and a second dielectric layer which are formed of different materials. The gate electrode may be only disposed in the first dielectric layer.

The semiconductor layer may comprise a nucleation layer disposed on the substrate, a buffer layer disposed on the nucleation layer, and a channel layer disposed on the buffer layer. The channel layer may include a silicon carbide based material. The semiconductor device may further comprise a barrier layer disposed on the channel layer, wherein the barrier layer and the channel layer form a heterojunction structure together so that a two-dimensional electron gas layer arises between the barrier layer and the channel layer, the source electrode and the drain electrode may be electrically contacted with the two-dimensional electron gas layer. A recess may be formed in the barrier layer, the gate electrode may be at least partially disposed in the recess in the barrier layer.

The source field plate may at least partially overlap the gate electrode, and may extend in a direction from an edge of the gate electrode to the drain electrode.

The source field plate may be separated from the gate electrode and the semiconductor layer.

A method of manufacturing a semiconductor device comprises the steps of:

forming a semiconductor layer on a substrate;

depositing a dielectric layer on the semiconductor layer, and forming a source electrode and a drain electrode which contact the semiconductor layer, and forming a gate electrode on the semiconductor layer between the source electrode and the drain electrode;

forming at least a recess in the dielectric layer; and depositing a source field plate which at least partially covers the recess, and electrically connecting the source field plate to the source electrode through at least a conductive path.

The step of depositing the dielectric layer may comprise depositing a first dielectric layer and depositing a second dielectric layer. The steps of forming the source electrode, the drain electrode and the gate electrode may be performed between depositing the first dielectric layer and depositing the second dielectric layer.

The step of forming the semiconductor layer may comprise:

forming a nucleation layer on the substrate;

forming a buffer layer on the nucleation layer; and depositing a channel layer on the buffer layer.

The method may further comprise:

forming a barrier layer on the channel layer after depositing the channel layer so that a two-dimensional electron gas layer arising at an interface between the barrier layer and the channel layer; and electrically contacting the source electrode and the drain electrode with the two-dimensional electron gas layer.

As described above, the semiconductor device according to embodiments of the present invention includes at least a recess in the dielectric layer, so that the part of dielectric layer corresponding to the recess has relatively smaller thickness, therefore the electric field intensity at this part becomes strong, thereby preventing the effect of modulating the electric field distribution by the source field plate becoming weak due to increase of thickness of the dielectric layer.

Accordingly, with the embodiments of the present invention, the effect of the source field plate can be implemented thoroughly, and meanwhile Cgs can be reduced, thus the peak electric field of the edge of the gate electrode can be decreased, the breakdown voltage of the device can be increased, the gate leakage current of the device can be reduced, the frequency characteristics of the device can be improved, so that the advantage of high output power of the device can be maximized.

BRIEF DESCRIPTION OF DRAWINGS

These and/or other aspects will become apparent and more readily appreciated from the following description of the embodiments, taken in conjunction with the accompanying drawings in which.

DETAILED DESCRIPTION

Figure 1:
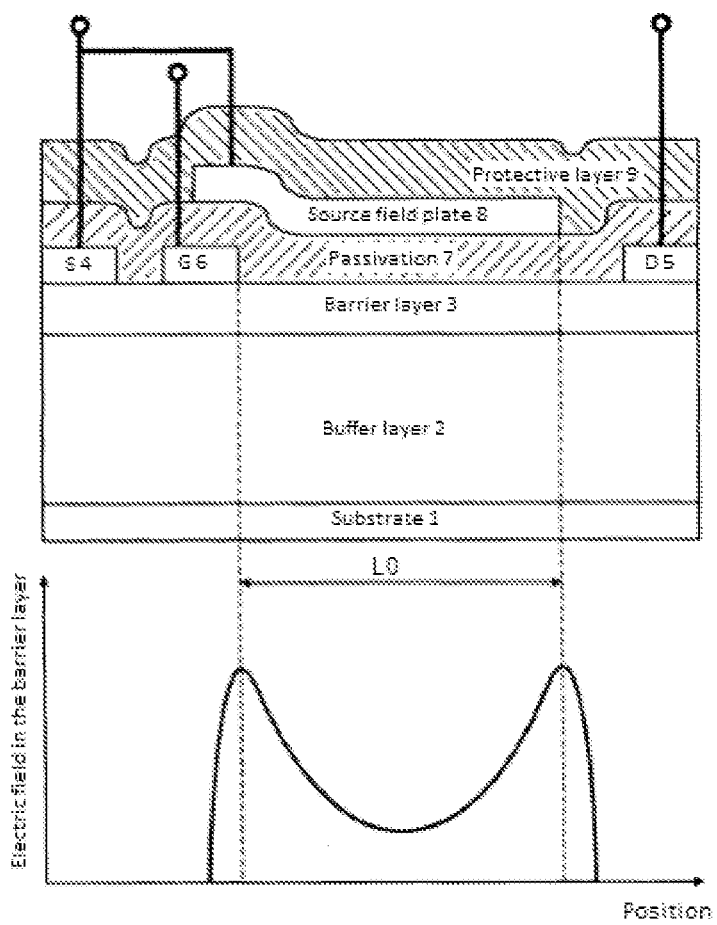
FIG. 1 is a schematic view illustrating a structure of a HEMT having a source field plate according to the prior art.
Figure 2:
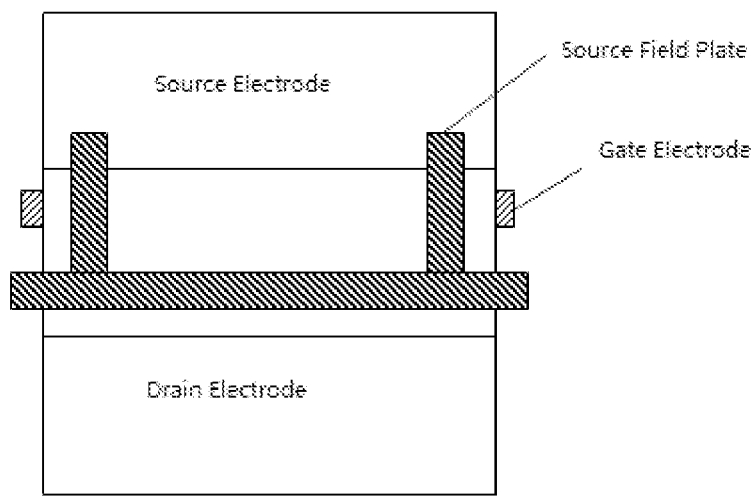
FIG. 2 is a schematic view illustrating an approach of reducing Cgs by reducing an area of a portion of the source field plate overlapping a gate electrode according to the prior art.
Figure 3:
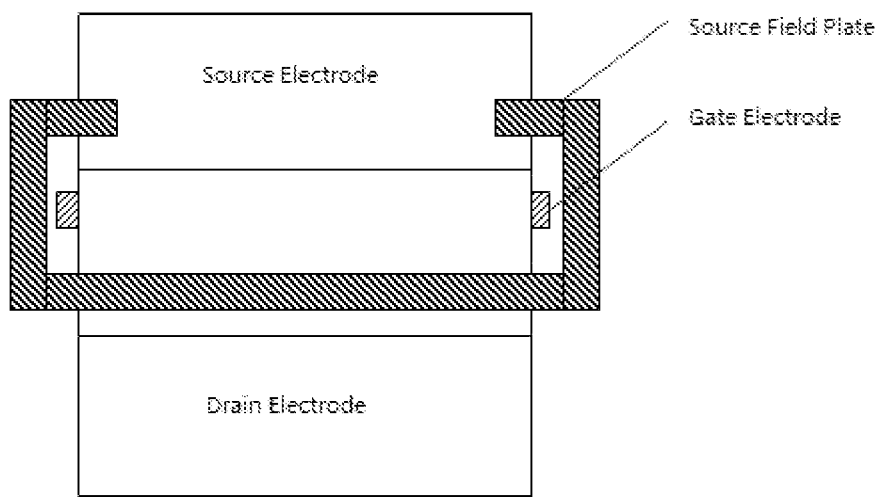
FIG. 3 is a schematic view illustrating another approach of reducing Cgs by reducing an area of a portion of the source field plate overlapping the gate electrode according to the prior art.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween.

As discussed in the background section, use of source field plates to increase the breakdown voltage of semiconductor devices increases gate-source capacitance Cgs of devices, which deteriorates frequency characteristics of devices. In order to reduce Cgs, in the prior art, an approach of reducing an area of a portion of the source field plate overlapping the gate electrode is adopted. However, this approach will delay frequency response of devices and affect frequency characteristics of devices.

The inventors of the present invention have recognized that Cgs can also be reduced by increasing a thickness of dielectric material under the source field plate. However, once the thickness of the dielectric material increases, the effect of modulating electric field distribution by the source field plate becomes weak, thus losing the advantage of use of the source field plate. To resolve such a problem, the inventors of the present invention propose an approach of increasing the thickness of the dielectric material and meanwhile forming at least a recess in the dielectric material, which will be described in detail thereinafter.

Figure 4A:
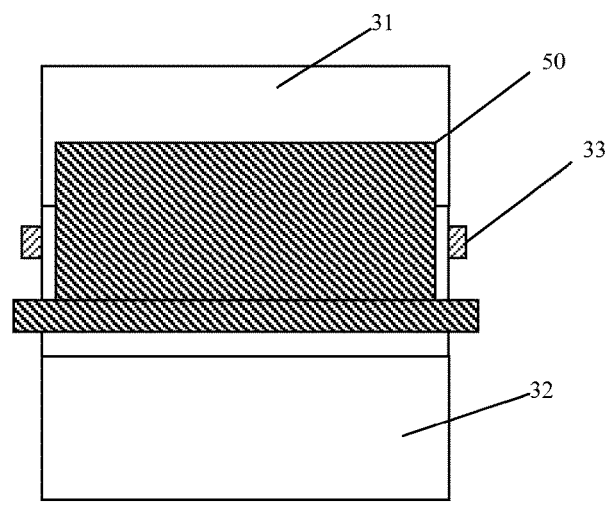
FIG. 4A is a schematic planar view illustrating a semiconductor device according to a first embodiment of the present invention.
Figure 4B:
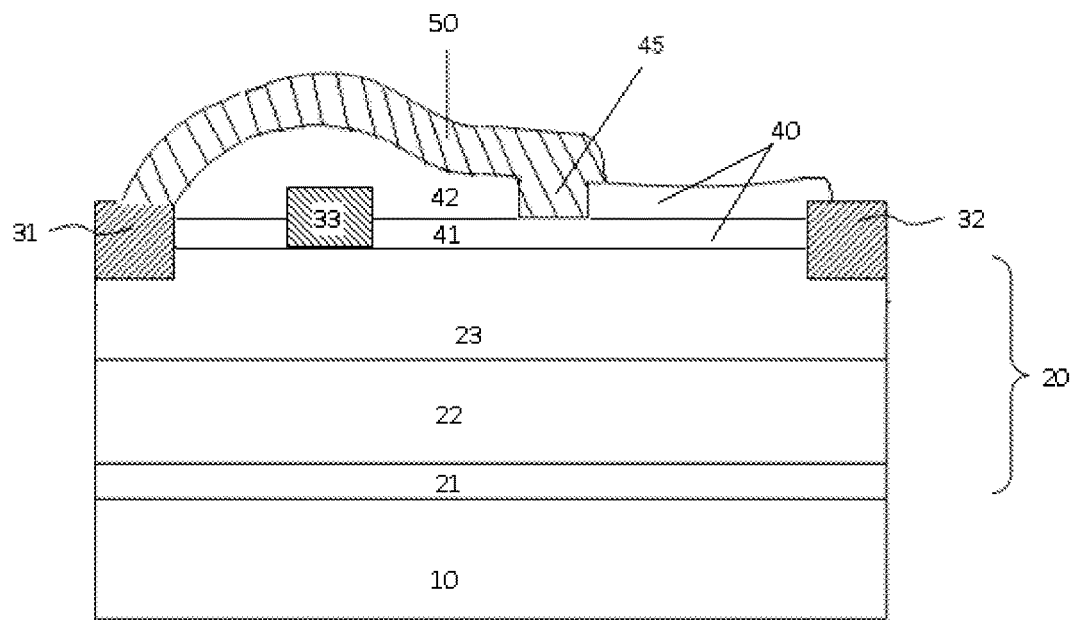
FIG. 4B is a schematic sectional view illustrating the semiconductor device according to the first embodiment of the present invention.

FIG. 4A is a schematic planar view illustrating a semiconductor device according to a first embodiment of the present invention, and FIG. 4B is a schematic sectional view illustrating the semiconductor device according to the first embodiment of the present invention.

Referring to FIGS. 4A and 4B, the semiconductor device according to the first embodiment of the present invention includes a substrate 10, a semiconductor layer 20, a source electrode 31, a drain electrode 32, a gate electrode 33, a dialectic layer 40 and a source field plate 50.

The substrate 10 may be selected from the group consisting of sapphire, silicon carbide, silicon, lithium niobate, insulating substrate silicon, gallium nitride, aluminum, zinc oxide, or any other material on which an III group nitride material can grow.

The semiconductor layer 20 is disposed on the substrate 10. The semiconductor layer 20 comprises: a nucleation layer 21 disposed on the substrate 10; a buffer layer 22 disposed on the nucleation layer 21; and a channel layer 23 disposed on the buffer layer 22. The nucleation layer 21 affects crystal quality, surface morphology and electrical properties and other parameters of a heterojunction structure formed above. The nucleation layer 21 varies with the material of the substrate 10, and is mainly used to match the material of the substrate 10 and the semiconductor material in the heterojunction structure. The buffer layer 22 is used to not only adhere the channel layer 23, but also protect the substrate 10 from invasion of some metal ions. The buffer layer 22 may be formed of III group nitride materials, such as AlGaN, GaN or AlGaInN. The channel layer 23 may be formed of nitride material, or may include silicon carbide based material.

The source electrode 31 and the drain electrode 32 are in contact with the channel layer 23. The gate electrode 33 is located between the source electrode 31 and the drain electrode 32 and is disposed on the semiconductor layer 20.

The dielectric layer 40 is disposed on the gate electrode 33 as well as on at least a part of the surface of the semiconductor layer 20 which is between the gate electrode 33 and the drain electrode 32. The dielectric layer 40 can also be disposed on a part of the surface of the semiconductor layer 20 which is between the gate electrode 33 and the source electrode 31. The dielectric layer 40 may be formed as one layer of a single material, or may be a multi-layer formed of different dielectric materials. For example, as shown in FIG. 4B, the dielectric layer 40 comprises a first dielectric layer 41 and a second dielectric layer 42 which are formed of different materials.

The dielectric layer 40 can be thick enough to reduce Cgs, for example, may have a thickness of 100 nm-1000 nm.

A recess 45 is disposed in the dielectric layer 40 and disposed between the gate electrode 33 and the drain electrode 32. The recess 45 is opened on the upper surface of the dielectric layer 40 and may extend inside the dielectric layer 40, or alternatively, may extend to the upper surface of the semiconductor layer 20, for example, the upper surface of the channel layer 23, so that the electric field distribution at the region where the recess 45 and the semiconductor layer 20 contact is more affected, and the effect of modulating the electric field distribution by the source field plate is enhanced.

The source field plate 50 is disposed on the dielectric layer 40 having the recess 45, and is electrically connected to the source electrode 31 through at least a conductive path. In order to accelerate frequency response of the device, an area of the source field plate 50 can be large enough, and the source field plate 50 at least partially overlaps the gate electrode 33, and extends in the direction from an edge of the gate electrode 33 to the drain electrode 32. The source field plate 50 at lease partly covers the recess 45 in the dielectric layer 40. In other words, the source field plate 50 may completely covers the recess 45 in the dielectric layer 40, or alternatively, partly covers the recess 45 in the dielectric layer 40.

In addition, the dielectric layer 40 may at least partially covers the gate electrode 33 and the source field plate 50 at least partially overlaps the gate electrode 33. The source field plate 50 may be separated from the gate electrode 33 and the semiconductor layer 20.

Figure 5A:
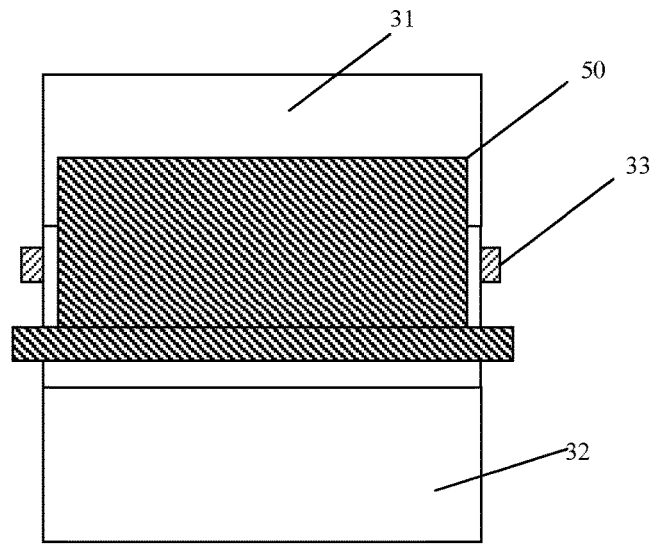
FIG. 5A is a schematic planar view illustrating a semiconductor device according to a second embodiment of the present invention.
Figure 5B:
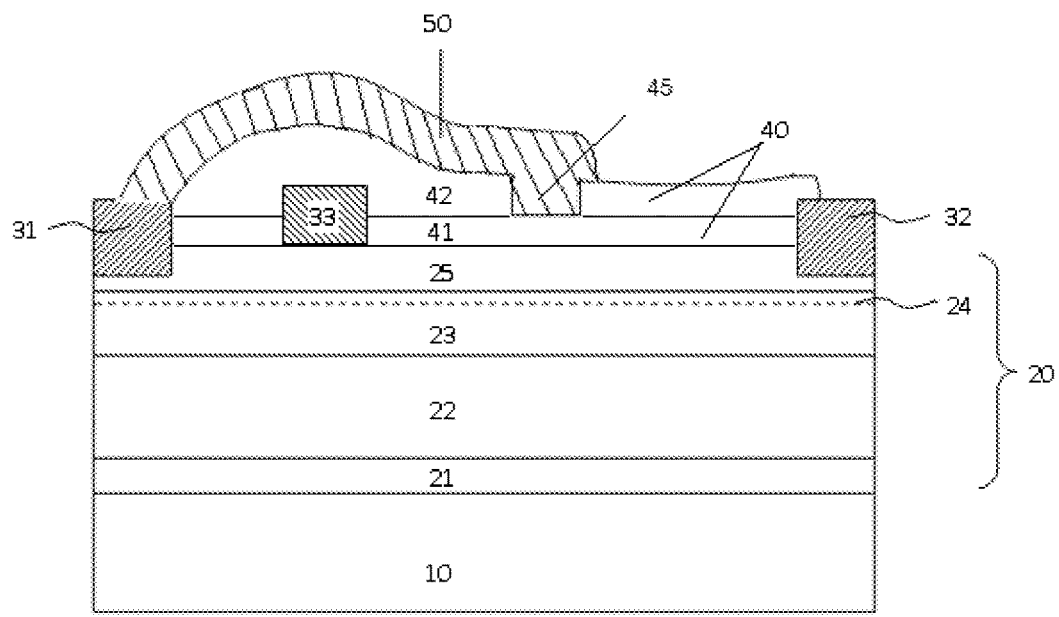
FIG. 5B is a schematic sectional view illustrating the semiconductor device according to the second embodiment of the present invention.

FIG. 5A is a schematic planar view illustrating a semiconductor device according to a second embodiment of the present invention, and FIG. 5B is a schematic sectional view illustrating the semiconductor device according to the second embodiment of the present invention.

Referring to FIGS. 5A and 5B, compared with the semiconductor device according to the first embodiment of the present invention, a barrier layer 25 is added.

The barrier layer 25 is disposed on the channel layer 23. The barrier layer 25 and the channel layer 23 form a heterojunction structure together so that a 2DEG layer 24 arises at an interface between the barrier layer 25 and the channel layer 23.

The source electrode 31 and the drain electrode 32 are electrically contacted with the 2DEG channel 24. When a proper bias voltage is applied to the gate electrode 33 which is disposed on the semiconductor layer 20 and between the source electrode 31 and the drain electrode 32, a current flows through the heterogeneous interface between the channel layer 23 and the barrier layer 25, two-dimensional electron gas is induced thereto and moves along the 2DEG channel 24 between the source electrode 31 and the drain electrode 32, and the barrier layer 25 acts as a barrier.

Except for the above-mentioned structure, the semiconductor device according to the second embodiment of the present invention is substantially the same as that according to the first embodiment of the present invention, repeated description will be omitted in order to avoid redundancy.

Figure 6:
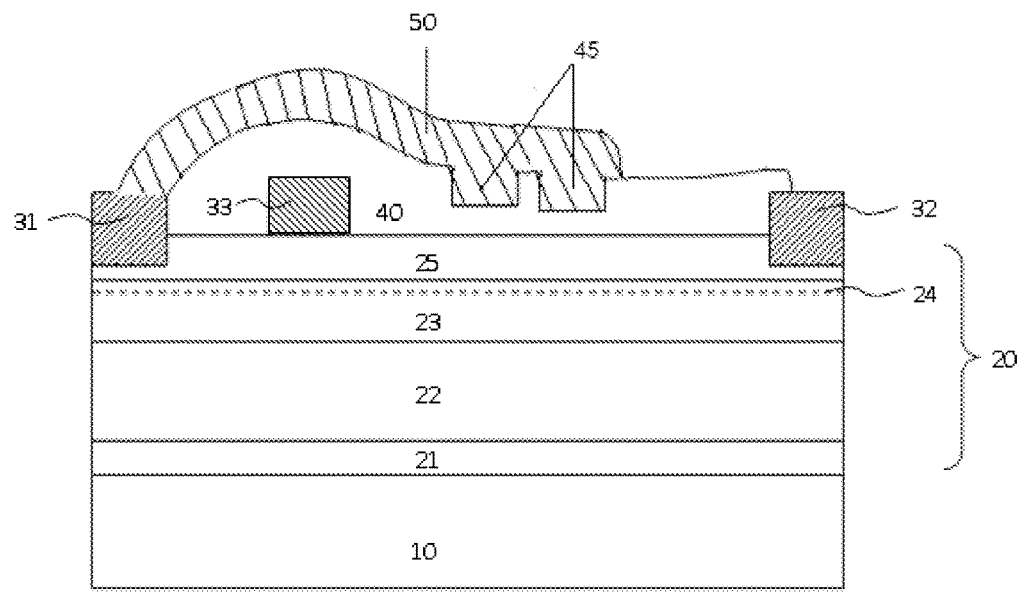
FIG. 6 is a schematic sectional view illustrating a semiconductor device according to a third embodiment of the present invention.

FIG. 6 is a schematic sectional view illustrating a semiconductor device according to a third embodiment of the present invention. Referring to FIG. 6, there may be a plurality of recesses 45 in the dielectric layer 40, for example two recesses 45 as shown. The plurality of recesses 45 may be arranged in a direction from the source electrode 31 to the drain electrode 32. The plurality of recesses 45 may have the same depths. Alternatively, the depths of the plurality of recesses 45 may be in ascending order in the direction from the source electrode 31 to the drain electrode 32, which is more advantageous to prevent the effect of the electric field distribution becoming weak.

Except for the above-mentioned structure, the semiconductor device according to this embodiment of the present invention is substantially the same as that according to the first embodiment or the second embodiment of the present invention, repeated description will be omitted in order to avoid redundancy.

Figure 7:
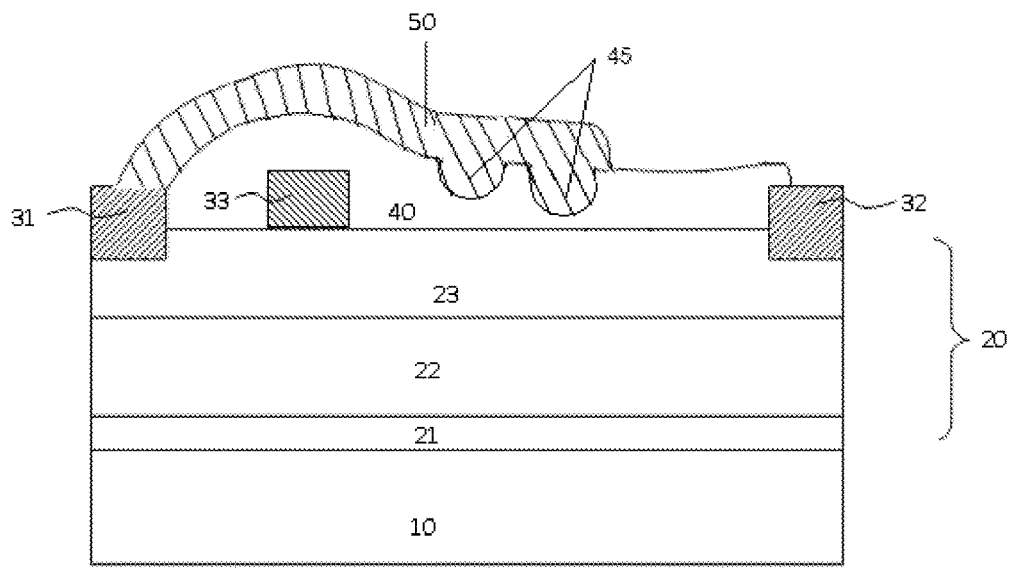
FIG. 7 is a schematic sectional view illustrating a semiconductor device according to a fourth embodiment of the present invention.

FIG. 7 is a schematic sectional view illustrating a semiconductor device according to a fourth embodiment of the present invention. Referring to FIG. 7, in this embodiment, the recess 45 in the dielectric layer 40 has a curved bottom, which is more advantageous to prevent the effect of the electric field distribution becoming weak. In addition, the recess 45 may have a cross-section shape of rectangle, or inverted trapezoid, or curve, or combinations thereof. The semiconductor device having the recess 45 with the cross-section shape of inverted trapezoid or curve can bear a higher voltage.

Except for the above-mentioned structure, the semiconductor device according to this embodiment of the present invention is substantially the same as that according to the first embodiment or the second embodiment of the present invention, repeated description will be omitted in order to avoid redundancy.

Figure 8:
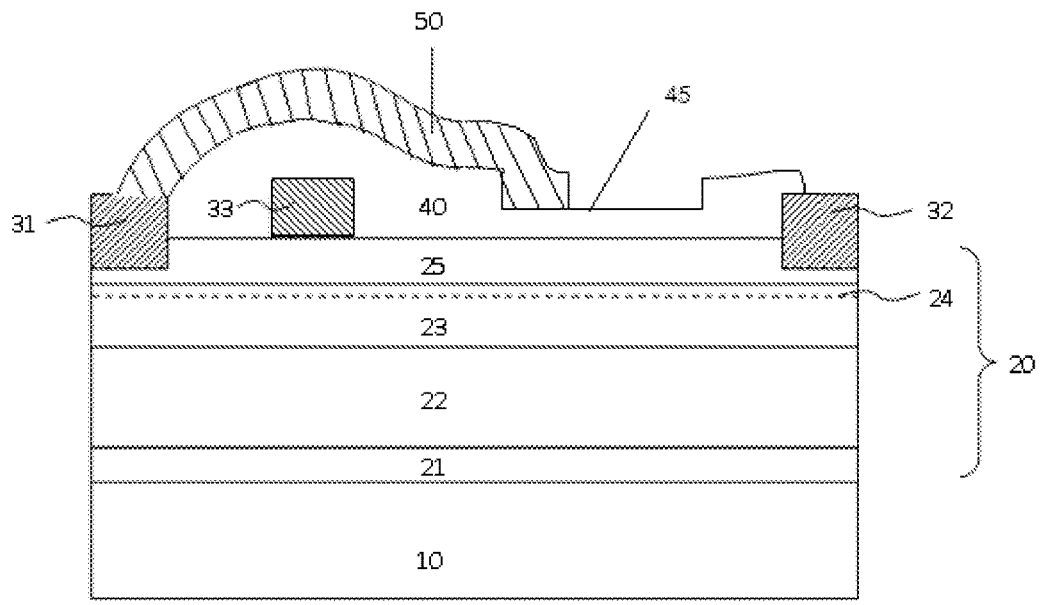
FIG. 8 is a schematic sectional view illustrating a semiconductor device according to a fifth embodiment of the present invention.

FIG. 8 is a schematic sectional view illustrating a semiconductor device according to a fifth embodiment of the present invention. Referring to FIG. 8, in this embodiment, the source field plate 50 partly covers the recess 45 in the dielectric layer 40.

Except for the above-mentioned structure, the semiconductor device according to this embodiment of the present invention is substantially the same as that according to the first embodiment or the second embodiment of the present invention, repeated description will be omitted in order to avoid redundancy.

Figure 9:
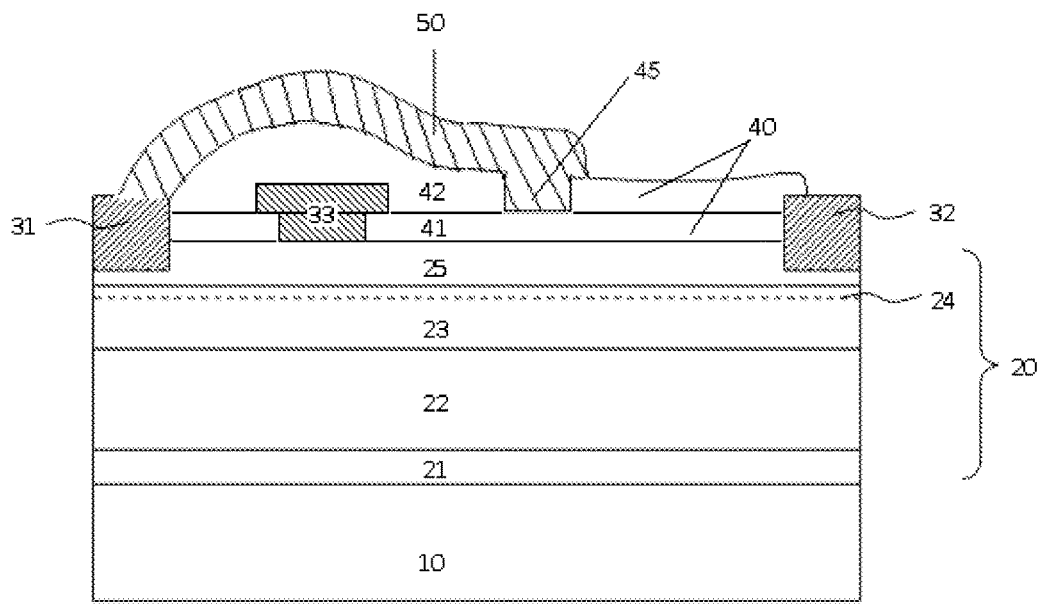
FIG. 9 is a schematic sectional view illustrating a semiconductor device according to a sixth embodiment of the present invention.

FIG. 9 is a schematic sectional view illustrating a semiconductor device according to a sixth embodiment of the present invention. Referring to FIG. 9, in this embodiment, the gate electrode 33 has a T shape. Besides T shape, the gate electrode 33 may have a gamma shape, or any other suitable shape.

Except for the above-mentioned structure, the semiconductor device according to this embodiment of the present invention is substantially the same as that according to the first embodiment or the second embodiment of the present invention, repeated description will be omitted in order to avoid redundancy.

Figure 10:
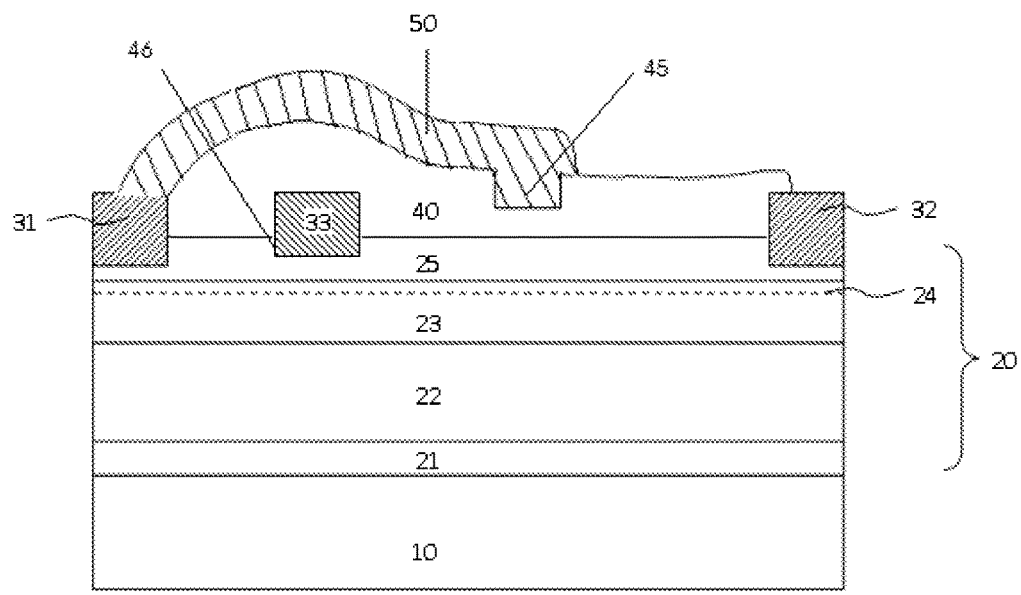
FIG. 10 is a schematic sectional view illustrating a semiconductor device according to a seventh embodiment of the present invention.

FIG. 10 is a schematic sectional view illustrating a semiconductor device according to a seventh embodiment of the present invention. Referring to FIG. 10, in this embodiment, a recess 46 is formed in the barrier layer 25, and the gate electrode 33 is at least partially disposed in the recess 46 in the barrier layer 25.

Except for the above-mentioned structure, the semiconductor device according to this embodiment of the present invention is substantially the same as that according to the second embodiment of the present invention, repeated description will be omitted in order to avoid redundancy.

Figure 11:
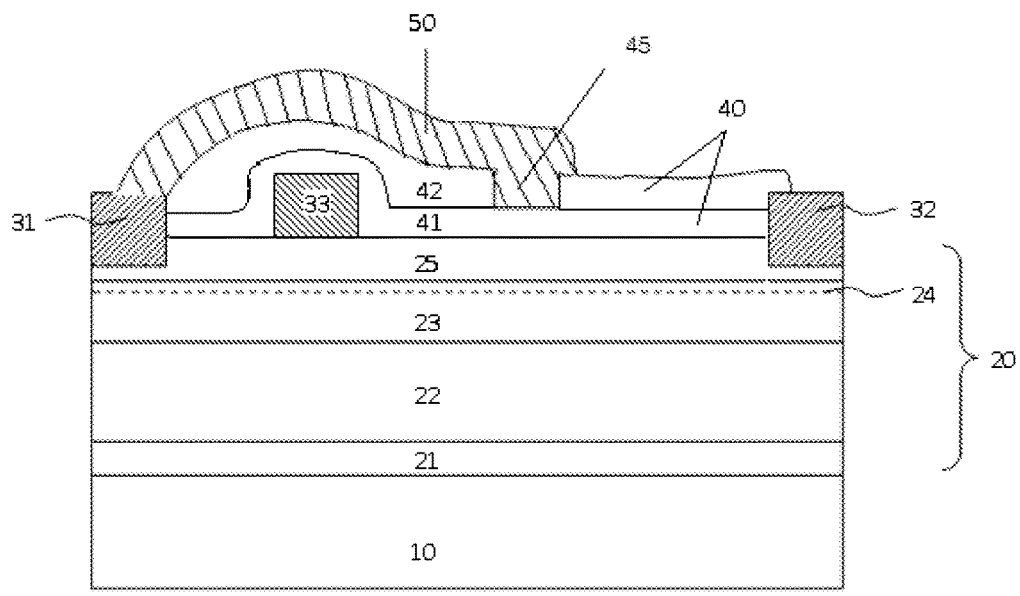
FIG. 11 is a schematic sectional view illustrating a semiconductor device according to an eighth embodiment of the present invention.

FIG. 11 is a schematic sectional view illustrating a semiconductor device according to an eighth embodiment of the present invention. Referring to FIG. 11, in this embodiment, the gate electrode 33 is only disposed in the first dielectric layer 41, unlike the first embodiment in which the gate electrode 33 is disposed in both the first dielectric layer 41 and the second dielectric layer 42, as shown in FIG. 4B.

Except for the above-mentioned structure, the semiconductor device according to this embodiment of the present invention is substantially the same as that according to the first embodiment or the second embodiment of the present invention, repeated description will be omitted in order to avoid redundancy.

A method of manufacturing the semiconductor device according to the second embodiment will be described hereinafter in reference to FIGS. 12A to 12G.

Figure 12A:
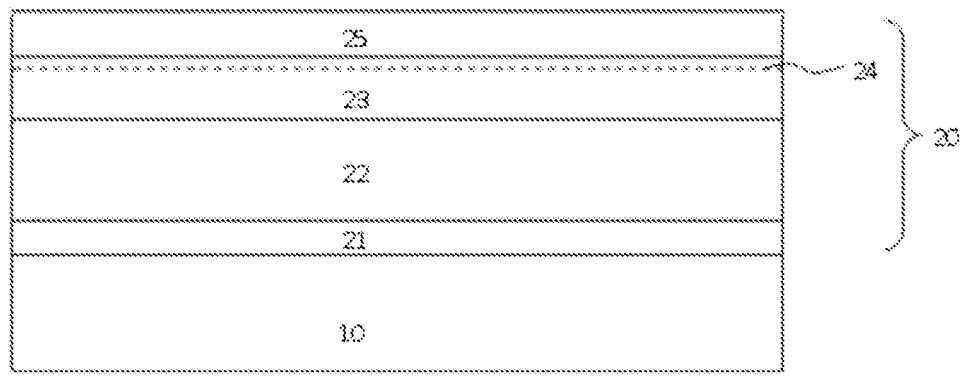
FIGS. 12A-12G illustrate steps of a method of manufacturing the semiconductor device according to the second embodiment of the present invention.

First, as shown in FIG. 12A, the semiconductor layer 20 is formed on the substrate 10. In detail, the nucleation layer 21 is formed on the substrate 10, the buffer layer 22 is formed on the nucleation layer 21 and the channel layer 23 is deposited on the buffer layer 21.

In this step, the substrate 10 may be selected from the group consisting of sapphire, silicon carbide, silicon, lithium niobate, insulating substrate silicon, gallium nitride, aluminum, zinc oxide, or any other material on which an III group nitride material can grow.

The nucleation layer 21 affects crystal quality, surface morphology and electrical properties and other parameters of the heterojunction structure above. The nucleation layer 21 varies with the material of the substrate 10, and is mainly used to match the material of the substrate 10 and the semiconductor material in the heterojunction structure.

The buffer layer 22 is used to not only adhere the channel layer 23, but also protect the substrate 10 from invasion of some metal ions. The buffer layer 22 may be formed of III group nitride materials, such as AlGaN, GaN or AlGaInN. The channel layer 23 may be formed of nitride material, or may include a silicon carbide based material.

After formation of the semiconductor layer 20, the barrier layer 25 is formed on the channel layer 23. The barrier layer 25 and the channel layer 23 form the heterojunction structure together so that the 2DEG channel 24 arises at the interface between the barrier layer 25 and the channel layer 23. The two-dimensional electron gas moves along the 2DEG layer 24, and the barrier layer 25 acts as a barrier.

It could be understood for those skilled in the art that the step of forming the barrier layer 25 can be omitted, thus the semiconductor device according to the first embodiment of the present invention can be manufactured.

Figure 12B:
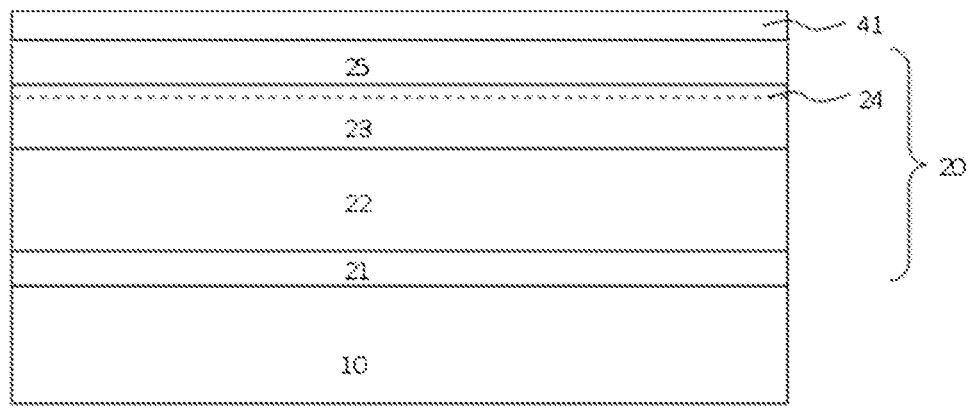

Next, as shown in FIG. 12B, the first dielectric layer 41 is deposited on the semiconductor layer 20. The first dielectric layer 41 acts as both a passivation layer and a dielectric layer.

Figure 12C:
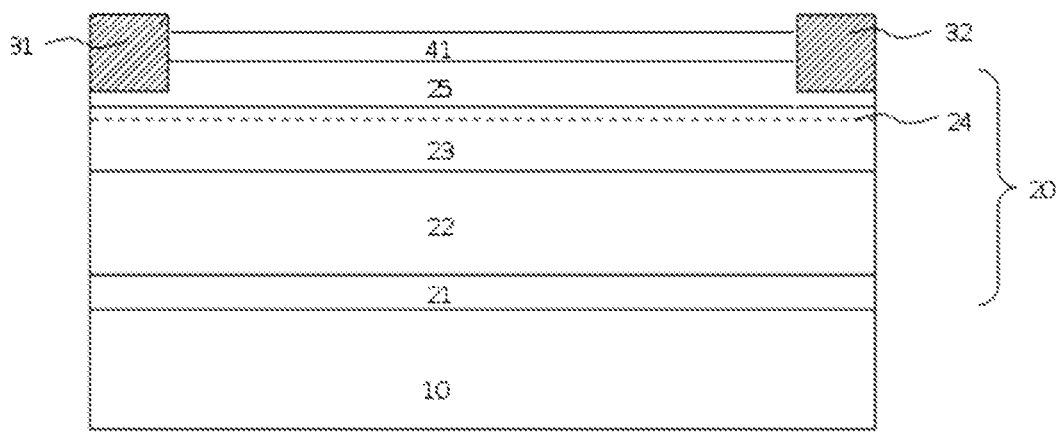

Next, as shown in FIG. 12C, the source electrode 31 and the drain electrode 32 are formed and electrically contacted with the semiconductor layer 20. If the barrier layer 25 is formed so that 2DEG layer 24 arises, the source electrode 31 and the drain electrode 32 are electrically contacted with the 2DEG layer 24 also.

Figure 12D:
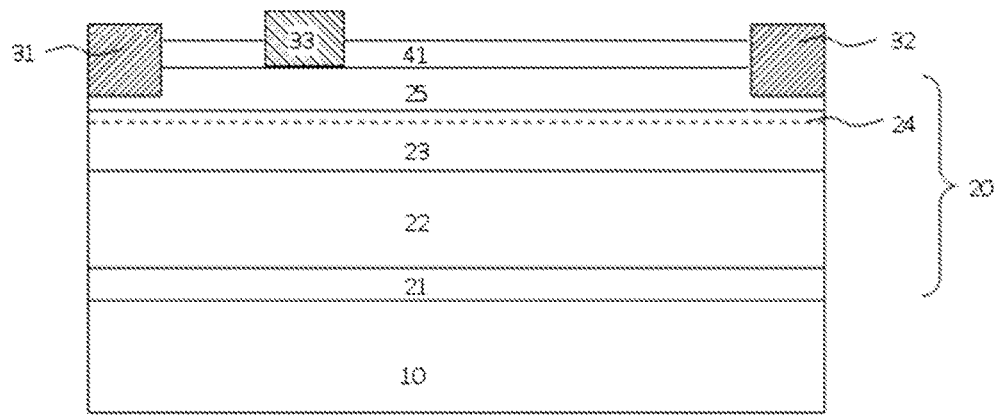

Next, as shown in FIG. 12D, the gate electrode 33 is formed on the semiconductor layer 33 between the source electrode 31 and the drain electrode 32.

Figure 12E:
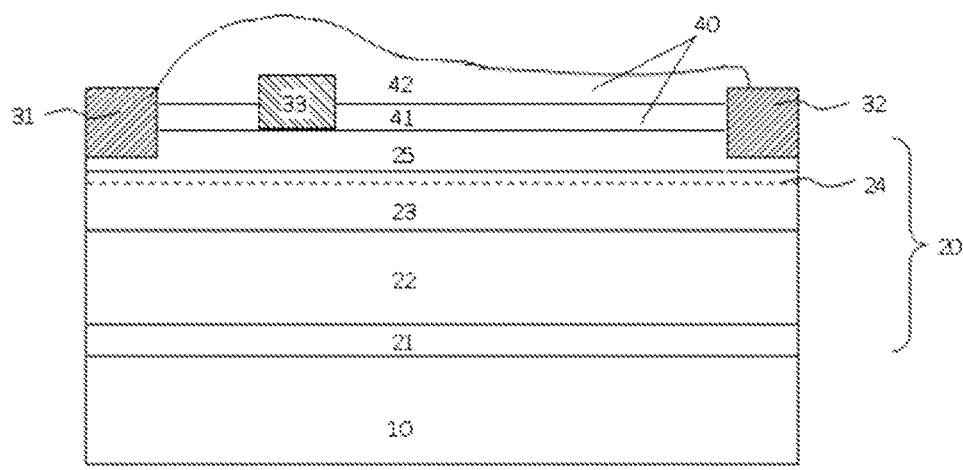

Next, as shown in FIG. 12E, the second dielectric layer 42 is deposited on the gate electrode 33 as well as on at least a part of the surface of the semiconductor layer 20 which is between gate electrode 33 and the drain electrode 32. The second dielectric layer 42 can also be disposed on a part of the surface of the semiconductor layer 20 which is between the gate electrode 33 and the source electrode 31. The first dielectric layer 41 and the second dielectric layer 42 form the dielectric layer 40 together. The dielectric layer 40 may have a thickness of 100 nm-1000 nm.

Figure 12F:
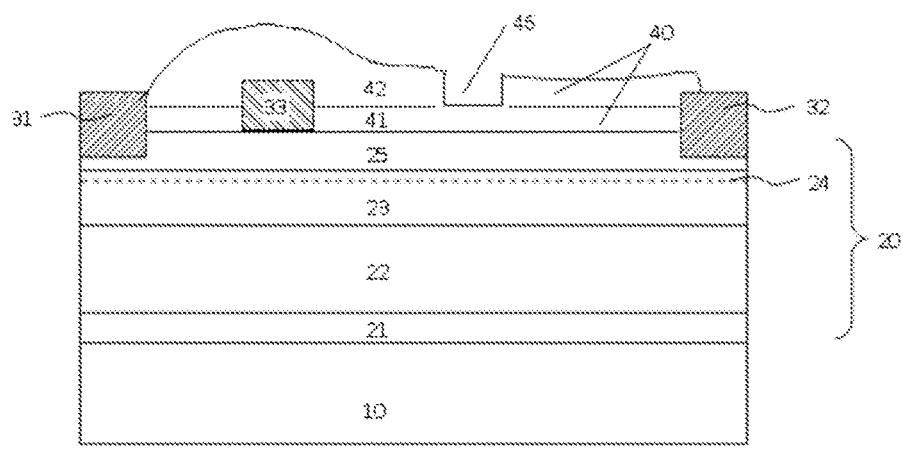

Next, as shown in FIG. 12F, the recess 45 is formed, for example etched, in the dielectric layer 40 and between the gate electrode 33 and the drain electrode 32. The recess 45 is opened on the upper surface of the dielectric layer 40 and may extend inside the dielectric layer 40, or alternatively, may extend to the upper surface of the semiconductor layer 20, for example, the upper surface of the channel layer 23.

Figure 12G:
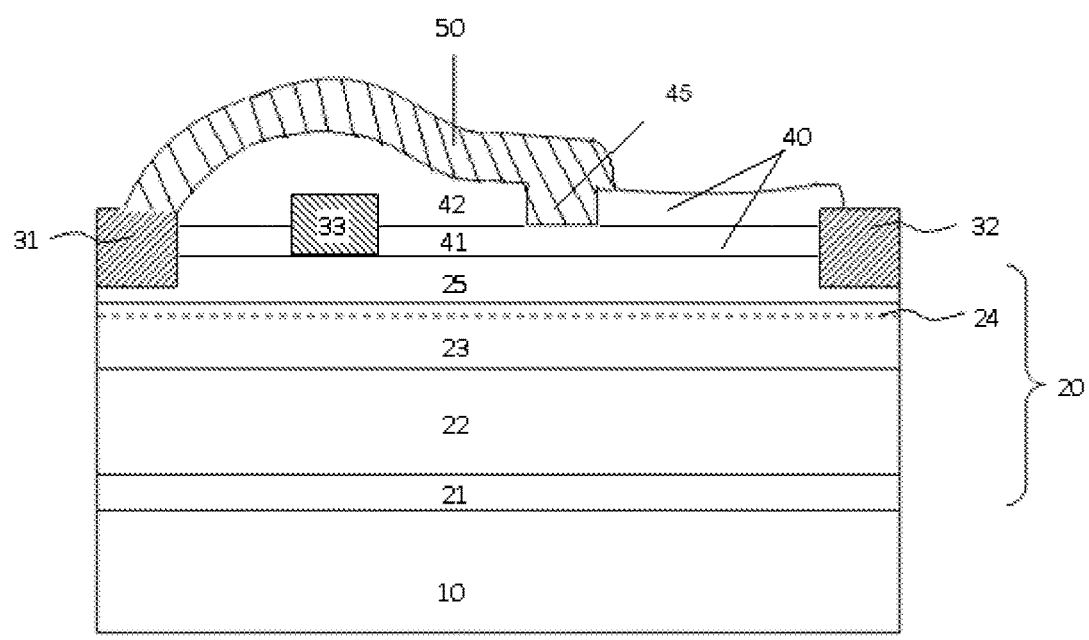

Finally, as shown in FIG. 12G, the source field plate 50 is deposited on the dielectric layer 40 having the recess 45, and is electrically connected to the source electrode 31 through at least a conductive path. In order to accelerate the frequency response of the device, the area of the source field plate 50 can be large enough, and the source field plate 50 at least partially overlaps the gate electrode 33, extends in the direction from an edge of the gate electrode 33 to the drain electrode 32. The source field plate 50 at lease partly covers the recess 45 in the dielectric layer 40.

With the semiconductor devices and methods of manufacturing the same in accordance with embodiments of the present invention, Cgs is reduced by increasing the thickness of the dielectric layer 40, rather than by reducing the area of a portion of the source field plate 50 overlapping the gate electrode 33, therefore the frequency effect and thus the frequency characteristics of the device is improved compared with the prior art. Meanwhile, in the embodiments of the present invention, at least a recess 45 is added in the dielectric layer 40, so that the part of dielectric layer 40 corresponding to the recess 45 has relatively smaller thickness, therefore the electric field intensity at this part becomes strong, thereby preventing the effect of modulating the electric field distribution by the source field plate 50 becoming weak due to increase of thickness of the dielectric layer 40. Accordingly, with the embodiments of the present invention, the effect of the source field plate 50 can be implemented thoroughly, and meanwhile Cgs can be reduced, thus the peak electric field of the edge of the gate electrode can be decreased, the breakdown voltage of the device can be increased, the gate leakage current of the device can be reduced, the frequency characteristics of the device can be improved, so that the advantage of high output power of the device can be maximized.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A semiconductor device, comprising:
   a substrate;
   a semiconductor layer disposed on the substrate;
   a source electrode and a drain electrode disposed on the semiconductor layer, and a gate electrode disposed between the source electrode and the drain electrode;
   a dielectric layer disposed on at least a part of the surface of the semiconductor layer which is between the gate electrode and the drain electrode, the dielectric layer having at least a recess therein; and
   a source field plate disposed on the dielectric layer and at least partially covering the recess, the source field plate being electrically connected to the source electrode through at least a conductive path,
   wherein the dielectric layer comprises a first dielectric layer and a second dielectric layer disposed on the first dielectric layer, and a bottom surface of the recess directly contacts an upper surface of the first dielectric layer.

2. The semiconductor device of claim 1, wherein the dielectric layer has a thickness of 100 nm-1000 nm.

3. The semiconductor device of claim 1, wherein the dielectric layer has a plurality of recesses therein.

4. The semiconductor device of claim 3, wherein the plurality of recesses are arranged in a direction from the source electrode to the drain electrode, and the depths of the plurality of recesses are in ascending order in the direction.

5. The semiconductor device of claim 1, wherein the recess has a cross-section shape of rectangle, or inverted trapezoid, or curve, or combinations thereof.

6. The semiconductor device of claim 1, wherein the recess has a curved bottom.

7. The semiconductor device of claim 1, wherein the gate electrode has a T shape or a gamma shape.

8. The semiconductor device of claim 1, wherein the gate electrode is only disposed in the first dielectric layer.

9. The semiconductor device of claim 1, wherein the semiconductor layer comprises a nucleation layer disposed on the substrate, a buffer layer disposed on the nucleation layer, and a channel layer disposed on the buffer layer.

10. The semiconductor device of claim 9, wherein the channel layer includes a silicon carbide based material.

11. The semiconductor device of claim 9, further comprising a barrier layer disposed on the channel layer, wherein the barrier layer and the channel layer form a heterojunction structure together so that a two-dimensional electron gas layer arises between the barrier layer and the channel layer, the source electrode and the drain electrode are electrically contacted with the two-dimensional electron gas layer.

12. The semiconductor device of claim 11, wherein a recess is formed in the barrier layer, the gate electrode is at least partially disposed in the recess in the barrier layer.

13. The semiconductor device of claim 1, wherein the source field plate at least partially overlaps the gate electrode, and extends in a direction from an edge of the gate electrode to the drain electrode.

14. The semiconductor device of claim 1, wherein the source field plate is separated from the gate electrode and the semiconductor layer.

15. A method of manufacturing a semiconductor device, comprising the steps of:
   forming a semiconductor layer on a substrate;
   depositing a first dielectric layer on the semiconductor layer, and forming a source electrode and a drain electrode which contact the semiconductor layer, and forming a gate electrode on the semiconductor layer between the source electrode and the drain electrode;
   depositing a second dielectric layer on the first dielectric layer, and forming at least a recess in the second dielectric layer, a bottom surface of the recess directly contacting an upper surface of the first dielectric layer; and
   depositing a source field plate which at least partially covers the recess, and electrically connecting the source field plate to the source electrode through at least a conductive path.

16. The method of claim 15, wherein the step of forming the semiconductor layer comprises:
   forming a nucleation layer on the substrate;
   forming a buffer layer on the nucleation layer; and
   depositing a channel layer on the buffer layer.

17. The method of claim 16, further comprising:
forming a barrier layer on the channel layer after depositing the channel layer so that a two-dimensional electron gas layer arising at an interface between the barrier layer and the channel layer; and
electrically contacting the source electrode and the drain electrode with the two-dimensional electron gas layer.

18. A semiconductor device, comprising:
a substrate;
a channel layer disposed on the substrate;
a source electrode and a drain electrode disposed on the channel layer, and a gate electrode disposed between the source electrode and the drain electrode;
a dielectric layer disposed on at least a part of the surface of the channel layer which is between the gate electrode and the drain electrode, the dielectric layer having at least a recess therein; and
a source field plate disposed on the dielectric layer and at least partially covering the recess, the source field plate being electrically connected to the source electrode through at least a conductive path,
wherein a bottom surface of the recess directly contacts the channel layer.

* * * * *